(12) United States Patent
Yatabe et al.

(10) Patent No.: US 10,475,569 B2
(45) Date of Patent: Nov. 12, 2019

(54) INDUCTOR AND PRINTED CIRCUIT BOARD

(71) Applicant: Taiyo Yuden Co., Ltd., Tokyo (JP)

(72) Inventors: Masuo Yatabe, Tokyo (JP); Kozue Imaizumi, Tokyo (JP); Noriyuki Mabuchi, Tokyo (JP); Kazuhiko Oyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 466 days.

(21) Appl. No.: 15/208,882

(22) Filed: Jul. 13, 2016

(65) Prior Publication Data
US 2017/0018351 A1 Jan. 19, 2017

(30) Foreign Application Priority Data

Jul. 14, 2015 (JP) .................................. 2015-140366

(51) Int. Cl.
*H01F 27/29* (2006.01)
*H01F 27/28* (2006.01)
*H05K 3/34* (2006.01)

(52) U.S. Cl.
CPC ....... *H01F 27/292* (2013.01); *H01F 27/2804* (2013.01); *H05K 3/3431* (2013.01); *H01F 2027/2809* (2013.01); *H05K 2201/0792* (2013.01); *H05K 2201/1003* (2013.01); *H05K 2201/10636* (2013.01);
(Continued)

(58) Field of Classification Search
CPC ....................................................... H01F 27/29
See application file for complete search history.

(56) References Cited

U.S. PATENT DOCUMENTS 6,218,925 B1 * 4/2001 Iwao .................. H01F 17/0013
336/200
9,911,529 B2 3/2018 Sasaki
(Continued)

FOREIGN PATENT DOCUMENTS

JP          H11-67554 A       3/1999
JP          H11-354326 A     12/1999
(Continued)

OTHER PUBLICATIONS

Notification of Reasons for Refusal Japanese Patent Application No. 2015-140366 dated Mar. 5, 2018 with English translation.
(Continued)

*Primary Examiner* — Elvin G Enad
*Assistant Examiner* — Malcolm Barnes
(74) *Attorney, Agent, or Firm* — Pillsbury Winthrop Shaw Pittman, LLP

(57) ABSTRACT

One object is to compensate the reduction of the Q value due to reduction of core sectional area of a coil of an inductor, and the reduction of positional accuracy and adhesive strength of components mounted on a printed circuit board due to reduction of area of external electrodes, both caused by downsizing of component sizes. An inductor is provided which includes: a coil formed in an insulator and having one end and the other end thereof formed in a direction away from a mounting surface; and lead-out portions connected to the coil at positions more distant from the mounting surface than a portion of the coil closest to the mounting surface.

7 Claims, 14 Drawing Sheets

(52) U.S. Cl.
CPC ....... *H05K 2203/048* (2013.01); *Y02P 70/611* (2015.11); *Y02P 70/613* (2015.11)

(56) References Cited

U.S. PATENT DOCUMENTS

| | | | | |
|---|---|---|---|---|
| 2006/0006972 | A1* | 1/2006 | Tozawa | H01F 17/0013 336/200 |
| 2010/0253464 | A1* | 10/2010 | Miyoshi | H01F 17/0013 336/200 |
| 2011/0032066 | A1* | 2/2011 | Chung | H01F 17/0013 336/200 |
| 2014/0285306 | A1* | 9/2014 | Sasaki | H01F 27/2804 336/200 |
| 2018/0019053 | A1* | 1/2018 | Ichikawa | H01F 38/30 |

FOREIGN PATENT DOCUMENTS

| | | | | |
|---|---|---|---|---|
| JP | H11354326 A | * | 12/1999 | ......... H01F 17/00 |
| JP | 3058164 | | 7/2000 | |
| JP | 2002305111 A | * | 10/2002 | ......... H01F 17/00 |
| JP | 2006-147790 A | | 6/2006 | |
| JP | 2006147790 A | * | 6/2006 | ......... H01F 17/00 |
| JP | 4019071 | | 12/2007 | |
| WO | 2013/103044 A1 | | 7/2013 | |

OTHER PUBLICATIONS

Notice of Reasons for Refusal dated Nov. 2, 2018 issued in corresponding JP Patent Application No. 2015-140366 wth English translation.

Notice of Reasons for Refusal dated Mar. 13, 2019 issued in corresponding JP Patent Application No. 2015-140366 with English translation.

* cited by examiner (reference example)

(reference example)

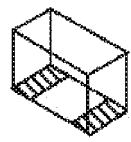 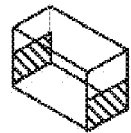 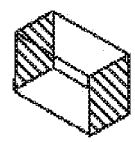
Fig. 20a　　Fig. 20b　　Fig. 20c
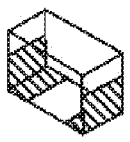 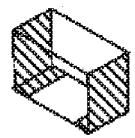
Fig. 21a　　Fig. 21b
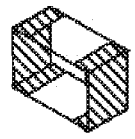 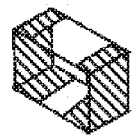
Fig. 22a　　Fig. 22b
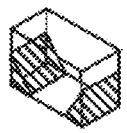 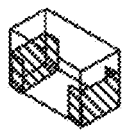 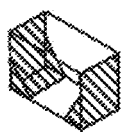 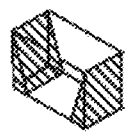 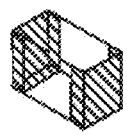
Fig. 23a　　Fig. 23b　　Fig. 23c　　Fig. 23d　　Fig. 23e
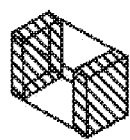 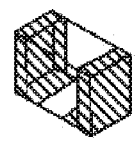
Fig. 24a　　Fig. 24b

INDUCTOR AND PRINTED CIRCUIT BOARD

CROSS-REFERENCE TO RELATED APPLICATIONS

This application is based on and claims the benefit of priority from Japanese Patent Application Serial No. 2015-140366 (filed on Jul. 14, 2015), the contents of which are hereby incorporated by reference in their entirety.

TECHNICAL FIELD

The present invention relates to an inductor electronic component and a printed circuit board, exemplified by a printed circuit board used in mobile phones or personal digital assistants and an inductor electronic component (hereinafter referred to simply as "an inductor") having an external electrode surface-mounted on the printed circuit board. Additionally, an inductor may also be referred to simply as "a component" when an outer form thereof is noted.

BACKGROUND

Mobile terminals such as mobile phones and personal digital assistants have recently found wide use as the mobile communication system develops. There has been a demand for smaller sizes and improved high-frequency characteristics of inductors in order to reduce the size and increase the performance of these mobile terminals.

To meet such a demand, a coil may be formed perpendicularly to the mounting surface having a size reduced by downsizing, such that the core area of a coiled conductor is larger. This is advantageous in securing Q value (a quality factor). The laminated inductor disclosed in Japanese Patent No. 3058164 having such a structure has been known as a type of inductors. Further, to meet such a demand, the lead-out conductor may have the same width as the coiled conductor, so as to restrain the lead-out conductor from impeding the magnetic flux generated from the coiled conductor. This is advantageous in restraining the decrease in Q value. Still further, no external electrodes may be substantially present on a side surface intersecting the axial direction of the coil, such that the magnetic flux are not largely impeded by an external electrode. This is advantageous in restraining the decrease in Q value. For example, the laminated inductor disclosed in Japanese Patent No. 4019071 is known to have the above features.

With the development of the mobile communication system, electronic instruments which have already been downsized to a portable size are being further downsized to a wearable size that allows integration with human bodies. Accordingly, there has been a demand that inductors should also be further downsized beyond the conventional component size and the Q value should be recovered which has been decreased due to reduction of the core sectional area by the downsizing. Additionally, as the electronic instruments are downsized, there has been a demand for mountability (described later) achieved by reducing the area of the external electrodes that will deteriorate. It is demanded to enhance the positional accuracy and the adhesive strength of the components mounted on a printed circuit board.

Conventional measures to restrain reduction of the Q value of inductors were to restrict, in an inductor component, an internal conductor from blocking a part of the magnetic flux distributed from an opening of the coiled conductor via a side surface thereof to the other opening and reduce the floating capacitance generated by the internal conductor, as in the laminated inductors disclosed in Japanese Patent No. 3058164 and Japanese Patent No. 4019071.

Downsizing of components achieved recently leads to reduction in dimensions inside the component. Within the region influenced by the distributed magnetic flux generated around the coil, there are an external electrode, wiring on a printed circuit board on which components are mounted, and wiring in the printed circuit board (the wiring on the printed circuit board and the wiring in the printed circuit board will be hereinafter collectively referred to as "the wiring of the printed circuit board"). With the conventional techniques, when the external electrode and the wiring of the printed circuit board block the magnetic flux, the inductance (L value) is reduced and the Q value that is proportional to the inductance is also reduced.

The above-described means for restraining the reduction of the Q value restricts the freedom in design of an external electrode. The freedom in design refers to the freedom related to, e.g., the position of the connection between the lead-out conductor and the external electrode, the shape of the external electrode, and the area of the same. More specifically, the means for restraining the reduction of the Q value brings necessity that an external electrode should be formed to have a minimized area on the mounting surface only. Thus, with the conventional technique, it is difficult to design an external electrode for good mountability. Therefore, the mountability of the components cannot be retained.

SUMMARY

The present invention is intended to overcome the above problem. One object of the present invention is to provide a means for not only restraining the reduction of the Q value of an inductor but even ensuring mountability of the inductor.

The present invention provides an inductor comprising: an insulator having a plurality of surfaces including a mounting surface; a pair of external electrodes formed on one or more of the plurality of surfaces of the insulator; a coil formed in the insulator and having one end and the other end thereof formed in a direction away from the mounting surface; and lead-out portions having at least a portion thereof formed in the insulator, the lead-out portions being electrically connected to the external electrodes and the coil and connected to the coil at positions more distant from the mounting surface than a portion of the coil closest to the mounting surface.

The inductor may be characterized in that a portion or the entirety of conductors in the lead-out portions is bent or has a larger width than conductors in the coil.

The inductor may be characterized in that a portion or the entirety of conductors in the lead-out portions has a larger sectional area than conductors in the coil.

The inductor may be characterized in that conductors in the lead-out portions have a larger thickness than conductors in the coil.

The inductor may be characterized in that the external electrodes are formed on two or more surfaces of the insulator, and the lead-out portions are connected to the external electrodes formed on the two or more surfaces of the insulator.

The inductor may be characterized in that the lead-out portions are connected to the external electrodes on two or more planar or linear areas.

The inductor may be characterized in that the insulator is a lamination of insulating layers and conductors formed mainly on surfaces of the insulating layers.

A printed circuit board may have the inductor mounted thereon.

The inductors can be downsized, and simultaneously the Q values higher than those obtained by conventional fabrication methods can be obtained, and better mountability than in conventional fabrication methods can be achieved.

BRIEF DESCRIPTION OF THE DRAWINGS

FIG. 4c is a sectional view along the dotted line in FIG. 4a.

FIG. 20a shows an arrangement of external electrodes according to the embodiment; FIG. 20b shows an arrangement of external electrodes according to the embodiment; and FIG. 20c shows an arrangement of external electrodes according to the embodiment.

FIG. 21a shows an arrangement of external electrodes according to the embodiment; and FIG. 21b shows an arrangement of external electrodes according to the embodiment.

FIG. 22a shows an arrangement of external electrodes according to the embodiment; and FIG. 22b shows an arrangement of external electrodes according to the embodiment.

FIG. 23a shows an arrangement of external electrodes according to the embodiment; FIG. 23b shows an arrangement of external electrodes according to the embodiment; FIG. 23c shows an arrangement of external electrodes according to the embodiment; FIG. 23d shows an arrangement of external electrodes according to the embodiment; and FIG. 23e shows an arrangement of external electrodes according to the embodiment.

FIG. 24a shows an arrangement of external electrodes according to the embodiment; and FIG. 24b shows an arrangement of external electrodes according to the embodiment.

DESCRIPTION OF EXAMPLE EMBODIMENTS

Figure 1:
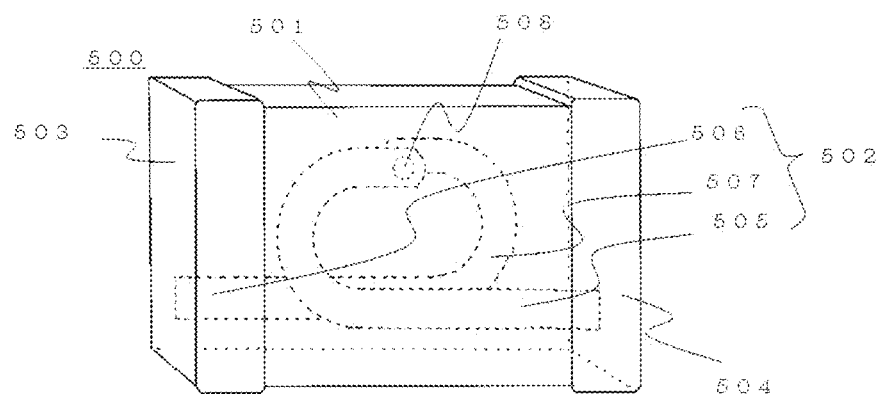
FIG. 1 is a perspective view of a conventional inductor.

In the following description, the features of the embodiments of the present invention will be listed and compared with those of the related art. The related art is basically configured such that the magnetic flux generated is least blocked by the conductor and, when the magnetic flux is blocked by the conductor, the floating capacitance caused by the blocking is minimized to prevent reduction of the Q value. In contrast, the embodiments of the present invention provide a means for generating magnetic flux such that the magnetic flux is distributed so as not to be affected by external electrodes or wiring of the printed circuit board. Further, the magnetic flux generated is blocked to alter the distribution of the magnetic flux such that the magnetic flux is not affected by the external electrodes or the wiring of the printed circuit board. One way to achieve such a feature is to increase the thickness of the conductor to reduce the internal conductor resistance, because a weak portion of the magnetic flux is less affected by eddy-current loss. Thus, the Q value can be increased.

The inductor according to the embodiment will be hereinafter described in further detail with reference to the drawings. First, a conventional inductor will be described with reference to a drawing. Second, an inductor of the related art will be described with reference to a drawing. Then, the embodiments will be described with reference to the drawings so as to demonstrate the difference from the above. The embodiments are not limited to the aspects shown in the drawings, and the dimensions of various portions of the drawings are not necessarily accurate because characteristic portions in the drawings are emphasized. In the following descriptions, the same elements or elements having the same function are denoted with the same numeral and are free of duplicate description. Further, although a portion of a surface of a component will be referred to as "a surface," the surface is not necessarily a plane but may include a rounded side or edge. The following embodiments are related to a laminated inductor as a surface mounting component, i.e., a type of inductor.

Figure 2:
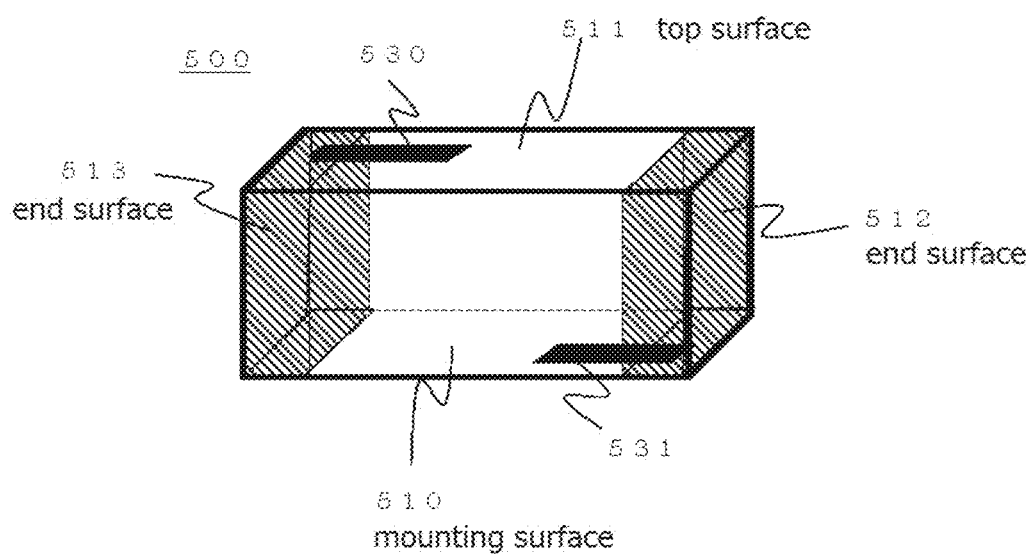
FIG. 2 is a perspective view of an external electrode and a marker of a conventional inductor.

First, the structure of a conventional laminated inductor is shown in FIG. 1 (including a coiled conductor in the laminated inductor represented by dotted lines) and FIG. 2 (perspectively showing hidden portions). The laminated inductor 500 may conventionally include a coiled conductor 502 composed mainly of silver or copper and having at least a portion thereof formed in an insulator 501 such as a glass-based ceramic material, and a pair of external electrodes 503, 504 composed mainly of silver, etc. and formed outside the insulator 501. The coiled conductor 502 may include a pair of lead-out portions 505, 506 electrically connected to the pair of external electrodes 503, 504 and a coil 507. The coil 507 may include a plurality of parts connected together with a via-hole conductor 508. The external electrodes 503, 504 may be mounted with solder, etc. on a land pattern formed of copper, etc. on a printed circuit board such as an epoxy substrate. Based on the positions and shapes of the external electrodes 503, 504, the surface 510 of the insulator 501 may be referred to as "a mounting surface" to be fixed on the printed circuit board. The surface 511 facing the mounting surface 510 may be referred to as "a top surface." The axis passing through the center of the coil 507 is defined as the "axis" of the coil 507. The two surfaces intersecting the axis of the coil 507 may be referred to as "side surfaces." Further, the two surfaces 512, 513 parallel with the axis of the coil 507 and adjacent to both the mounting surface 510 and the top surface 511 may be referred to as "end surfaces." The surfaces of the insulator 501 may be provided with direction identifying markers 530, 531 for image recognition of the mounting surface 510 by a mounting machine. As to the coiled conductor 502 including the coil 507 and the lead-out portions 505, 506, the direction parallel with the axis of the coil 507 may be referred to as the thickness of the conductor, and the direction orthogonal to the thickness may be referred to as the width of the conductor. This perception of the thickness and the width also applies to the thickness and the width of the paste used for forming a conductor pattern using a screen mask.

Figure 3A:
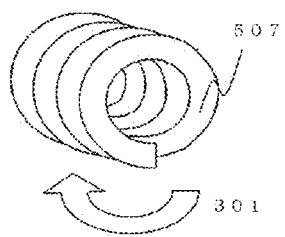
FIG. 3a is a perspective view of a conventional coil having clockwise turns.
Figure 3B:
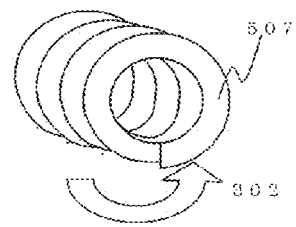
FIG. 3b is a perspective view of a conventional coil having counterclockwise turns.

Next, the related art will be described. FIGS. 3a and 3b show the coil 507 alone, which is coiled in the different directions between the drawings. When a voltage is applied across the coil 507, magnetic flux may be generated around the coil 507. The direction of the magnetic flux generated may be different depending on whether the coiling direction of the coil 507 is as shown by the arrow 301 in FIG. 3a (clockwise) or the arrow 302 in FIG. 3b (counterclockwise), but the density distribution shape of the magnetic flux is the same. Therefore, either structure is available.

Figure 3C:
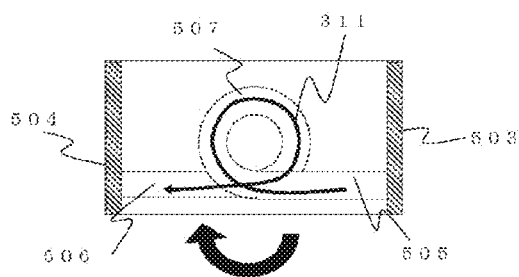
FIG. 3c is a perspective view of a laminated inductor including a conventional coil having clockwise turns.
Figure 3D:
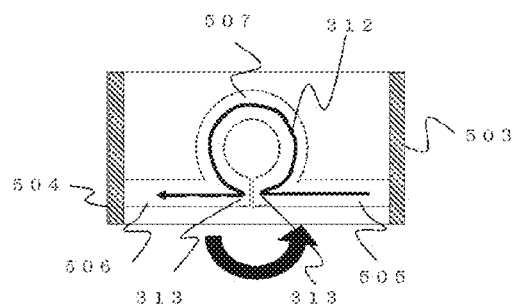
FIG. 3d is a perspective view of a laminated inductor including a conventional coil having counterclockwise turns.

The laminated inductor as an actual component requires a pair of external electrodes 503, 504 for passing electric current and a pair of lead-out portions 505, 506. These components are shown in FIGS. 3c and 3d that correspond to FIGS. 3a and 3b, respectively (the interior is represented by dotted lines). In FIG. 3c, the lead-out portions 505, 506 may directly connect between the coil 507 and the external electrodes 503, 504, and the direction of electric current is consistent between the coil 507 and the lead-out portions 505, 506. In contrast, in FIG. 3d, if the lead-out portions 505, 506 directly connect between the coil 507 and the external electrodes 503, 504, the direction 312 of electric current passing through the coil 507 and the lead-out portions 505, 506 is inconsistent at the turning portions 313 and is reversed. If the direction of electric current is inconsistent and reversed, the magnetic fluxes generated may cancel each other. Therefore, in conventional inductors, the configuration of FIG. 3c where the lead-out portions are connected such that the direction of electric current is consistent is preferable to that of FIG. 3d.

Embodiment 1

Figure 4A:
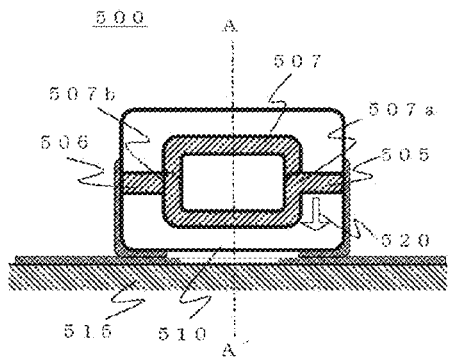
FIG. 4a is a perspective view of a laminated inductor of a related art.
Figure 4B:
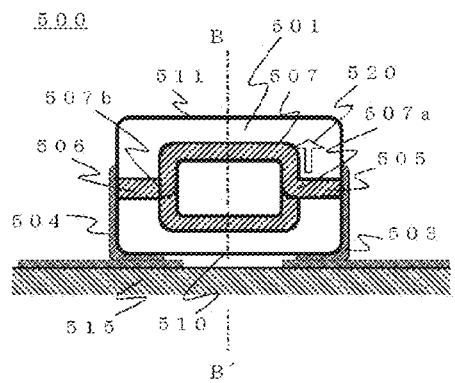
FIG. 4b is a perspective view of a laminated inductor of Embodiment 1.

Embodiment 1 will be hereinafter described with reference to the drawings. FIG. 4a is a schematic sectional view of a comparative example having a conventional structure; and FIG. 4b is a schematic sectional view of Embodiment 1. FIGS. 4a and 4b show the laminated inductor 500 shown in FIGS. 1 to 3d mounted on the printed circuit board 515. As to the density distribution of the magnetic flux generated by the coil 507 of the laminated inductor 500 mounted on the printed circuit board 515, which was not considered in the related art, the Inventors noted that the pattern of intensity of the density distribution of the magnetic flux is different depending on the coil 507, and studied the density distribution pattern. The Inventors found that when the coil 507 has one end 507a and the other end 507b thereof formed in the direction away from the mounting surface 510 as shown by the arrow 520, a region where the intensity of the density distribution of the magnetic flux is low can be produced on the printed circuit board 515 side. This is because such a coiling direction causes the portion of the coil 507 less than one turn to be positioned away from the mounting surface 510. The number of turns in the coil 507 may be larger in the region having the portion of the coil less than one turn and may be relatively smaller in the other region. Because less magnetic flux is generated in the region having a smaller number of turns of the conductor, a region where the intensity of the density distribution of the magnetic flux is low can be produced on the mounting surface 510 side and the printed circuit board 515 side.

Figure 4C:
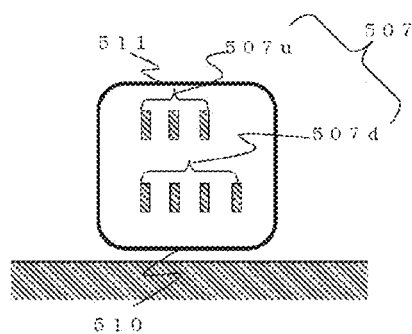
Figure 4D:
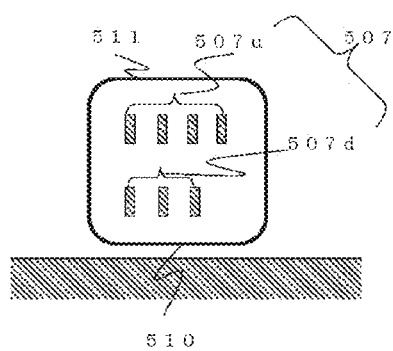
FIG. 4d is a sectional view along the dotted line in FIG. 4b.

FIGS. 4c and 4d show sectional views along the A-A dotted line in FIG. 4a and B-B' dotted line in FIG. 4b, respectively. Comparison in the number of turns in the coil 507 between the region 507d closer to the mounting surface and the region 507u closer to the top surface may show that, because the related art shown in FIG. 4c has the portion of the coil less than one turn on the mounting surface 510 side, the region 507d closer to the mounting surface may have one more turn than the region 507u closer to the top surface. In contrast, Embodiment 1 shown in FIG. 4d has the portion of the coil less than one turn on the top surface 511 side, and thus the region 507d closer to the mounting surface may have one less turn than the region 507u closer to the top surface. Because less magnetic flux is generated in the region having a smaller number of turns, the density distribution of the magnetic flux can be controlled by the coil 507. In the laminated inductor of Embodiment 1, a pair of external electrodes 503, 504 and the wiring of the printed circuit board fixed on the mounting surface 510 side may be positioned in the region where the intensity of the density distribution of the magnetic flux is low, thereby attaining a good Q value.

The Inventors noted that the magnetic flux on the mounting surface 510 side is affected by the magnetic flux generated from the lead-out portions 505, 506, and studied the distance between the mounting surface 510 and the lead-out portions 505, 506. When the distance from the mounting surface 510 to the connection portion between the lead-out portions 505, 506 and the coil 507 is larger than the smallest distance from the mounting surface 510 to the coil 507, the magnetic flux on the mounting surface 510 side can be reduced. Thus, the Q value can be increased collectively.

Figure 4E:
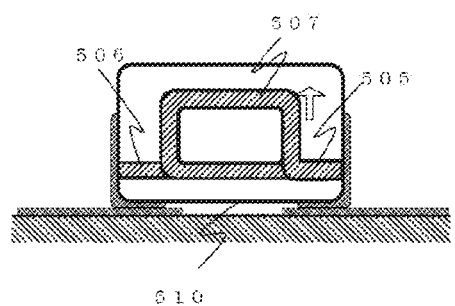
FIG. 4e is a perspective view of a laminated inductor of a first reference example.
Figure 4F:
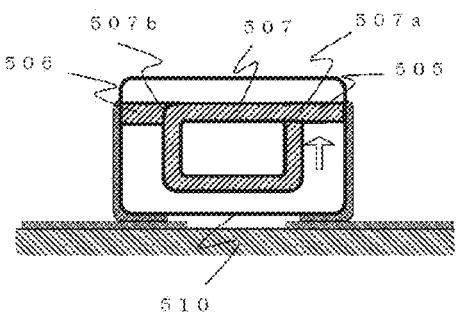
FIG. 4f is a perspective view of a laminated inductor of a second reference example.

FIGS. 4e and 4f show the first reference example and the second reference example, respectively, which are independent of Embodiment 1. In the first reference example, the distance from the mounting surface 510 to the connection portion between the lead-out portions 505, 506 and the coil 507 is not larger than the distance from the mounting surface 510 to the portion of the coil 507 closest to the mounting surface 510; and therefore, the first reference example is independent of Embodiment 1. In the second reference example, the coil 507 does not have one end 507a and the other end 507b thereof formed in the direction away from the mounting surface 510; and therefore, the second reference example is independent of Embodiment 1.

The laminated inductor of Embodiment 1 will be described in detail with reference to FIG. 4b. In the laminated inductor 500, which is fabricated by stacking the insulating layer and the conductor formed mainly on the surface of the insulating layer and then forming the external electrodes 503, 504, the coil 507 may have a spiral shape; and in this embodiment, the axis of the coil 507 may be parallel with the mounting surface 510. The coil 507 may be formed into a spiral shape along the axis by stacking the conductors having a substantially rectangular shape formed for each insulating layer while connecting the conductors with a via-hole conductor. The sectional shape of the coil 507 is not limited to a substantial rectangle but may be, e.g., a substantial oval or a combination of a rectangle and an oval. The coil 507 may have one end 507a and the other end 507b thereof formed in the direction away from the mounting surface 510 as shown by the arrow 520. The conductors forming the lead-out portions 505, 506 may be formed integrally with the conductors forming the coil 507. The lead-out portions 505, 506 and the coil 507 may be connected with each other at positions more distant from the mounting surface 510 than the portion of the coil 507 closest to the mounting surface 510.

A method of fabricating the laminated inductor using sheets will now be described in detail. First, a plurality of insulating green sheets may be prepared. The green sheets may be formed by applying an insulating slurry made mainly from glass, etc. onto a film by the doctor blade method, etc. The insulating material may also be a dielectric ceramic, ferrite, a soft magnetic alloy material, or a resin including an insulating material, in addition to the material composed mainly of glass. More specifically, the green sheets may be obtained by dispersing borosilicate glass powder having a dielectric constant of 5 and carbon black in alcohol along with a binder, and applying the obtained slurry onto a PET film by the doctor blade method while drying the slurry. The green sheets may be cut, and a predetermined number of via holes having a diameter of 50 μm may be produced at predetermined positions in the green sheet, that is, the positions at which via-hole conductors are to be formed, by laser processing using YAG laser or the like. Then, an electrically conductive paste, which is a precursor of a conductor pattern, may be printed at predetermined positions on the green sheets by screen masking or the like. The electrically conductive paste may be composed mainly of metals such as silver and copper. More specifically, a paste including silver, a binder, and an organic solvent may be used, and a conductor pattern may be printed in line with the via-holes by screen printing so as to have a pattern width of 70 μm and a thickness of 10 μm. The direction identifying marker pattern, which is optional in this embodiment, may be provided as follows. More specifically, a paste which is a precursor of the direction identifying marker pattern may be printed at predetermined positions on the green sheets by screen masking or the like. When the direction identifying marker is formed of an insulator, the insulating paste used for printing may be composed mainly of a non-metallic material and may be placed so as to be exposed to the surface opposite to the mounting surface (top surface) When the direction identifying marker is formed of a conductor, the conductive paste used for printing may be composed mainly of metals such as silver and copper and may be placed on the mounting surface so as to be exposed from both external electrodes by the same length. The coiled conductor pattern and the direction identifying marker pattern may be printed on separate green sheets such that these patterns are not in the same sectional layer after lamination.

Then, the green sheets, or the sheets having a coiled conductor pattern formed thereon, the sheets having the direction identifying marker pattern formed thereon, and sheets having nothing printed thereon may be stacked in a predetermined order (lamination) and subjected to a high temperature and a high pressure, or more specifically, 100° C. and 100 Kgf/cm², thereby to integrate the green sheets (pressure bonding). The insulating green sheets pressure bonded may be cut into chips by a dicing blade, and the chips may be burned for one hour at a temperature ranging from about 700° C. to about 900° C., or more specifically, at 900° C., to form a component body. The external electrodes may be formed by applying an electrically conductive paste composed mainly of silver or copper onto a surface of the lead-out portions of the component body where the conductor is exposed, baking the paste at a temperature ranging from about 600° C. to about 900° C., and then electroplating the paste. The electroplating may use Cu, Ni, Sn, etc. More specifically, the laminated inductor 500 may be completed by applying an electrically conductive paste including silver, a binder, and an organic solvent, burning the external electrodes at 700° C. for one hour, and plating the external electrodes with Ni and Sn by electric barrel plating. This embodiment can be fabricated by other methods such as the slurry build method or the film method and is not bound to the fabrication method using sheets. In Embodiment 1, the laminated inductor fabricated may have external dimensions of 0.6 mm wide by 0.3 mm deep by 0.4 mm high, 3.5 turns in the coil, and an inductance of 3.9 nH. The simulation of the magnetic flux density distribution may be calculated on an assumption that the laminated inductor is mounted on a coplanar printed circuit board including a substrate material having a dielectric constant of 3.4 and a copper foil having a thickness of 18 μm pasted on the substrate material.

Figure 5A:
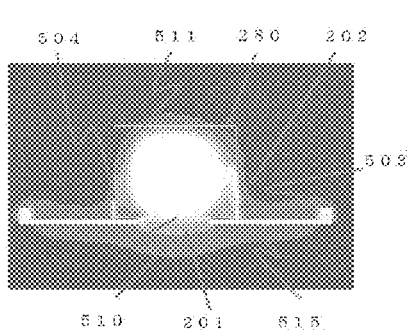
FIG. 5a is a magnetic flux density distribution simulation diagram for a sectional surface of a laminated inductor of a related art.
Figure 5B:
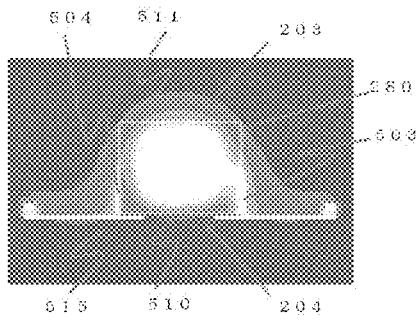
FIG. 5b is a magnetic flux density distribution simulation diagram for a sectional surface of a laminated inductor of Embodiment 1.

FIG. 5a is a magnetic flux density distribution simulation diagram of a related art; and FIG. 5b is a magnetic flux density distribution simulation diagram of Embodiment 1. The white line 280 represents the external shape of the component. In these drawings, the portions where the intensity of the magnetic flux density distribution is high are colored in white, whereas the portions where the intensity of the magnetic flux density distribution is low are colored in black. In the printed circuit board 515, the copper foil wiring on the surface thereof appears white, and the electric current lead-in portions on the left and right sides appear white. In FIG. 5a representing the related art, the magnetic flux is distributed intensively on the mounting surface 510 side, or the printed circuit board 515 side, as in the portion indicated by the arrow 201, and the magnetic flux is distributed weakly on the top surface 511 side, as indicated by the arrow 202. Conversely, in FIG. 5b showing the magnetic flux density distribution of Embodiment 1, the magnetic flux is distributed intensively on the top surface 511 side, as in the portion indicated by the arrow 203, and the intensity of the density distribution of the magnetic flux is low in a region on the mounting surface 510 side, or the printed circuit board 515 side, as in the portion indicated by the arrow 204. The external electrodes 503, 504 and the wiring of the printed circuit board may be positioned on the mounting surface 510 side, and the intensity of the density distribution of the magnetic flux near the mounting surface 510 in FIG. 5b is lower than in FIG. 5a.

Figure 6:
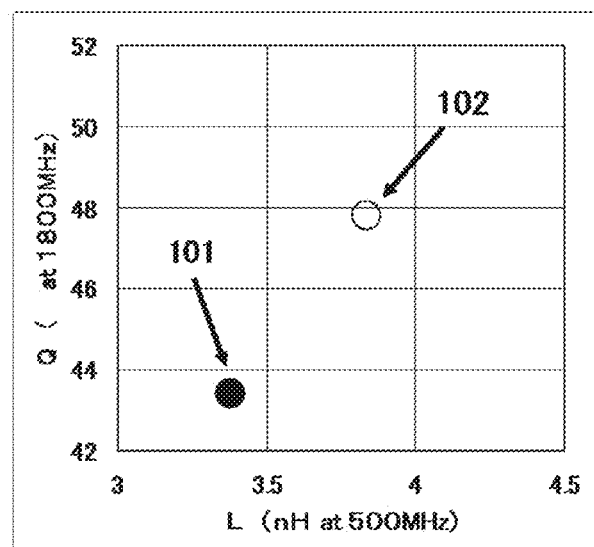
FIG. 6 shows the inductances (L values: 500 MHz) and the quality factors (Q values: 1800 MHz) of laminated inductors of a related art and Embodiment 1.

FIG. 6 shows actual inductance and the Q value for the related art and Embodiment 1. The magnitude of effect of eddy-current loss produced by the wiring of the printed circuit board may vary depending on the intensity of the density distribution of the magnetic flux on the printed circuit board side. Therefore, as opposed to the related art (101) in which the magnetic flux is distributed intensively on the printed circuit board side to produce large eddy-current loss, Embodiment 1 (102) in which the magnetic flux is distributed weakly on the printed circuit board side to produce less eddy-current loss may provide 13.5% higher inductance and a 10.2% higher Q value.

The following relationship is known in connection with eddy-current loss.

$$Pe = ke\frac{(tfBm)^2}{\rho} = ke\frac{(tE)^2}{\rho} \qquad \text{Formula 1}$$

(Pe: eddy-current loss, ke: proportionality coefficient, t: thickness of conductor, f: frequency, Bm: maximum magnetic flux density, ρ: resistivity of magnetic body, E: voltage) In Embodiment 1, when the laminated inductor is mounted on the printed circuit board, a region where the intensity of the density distribution of the magnetic flux is low may be produced around the coiled conductor. It is presumed that the eddy-current loss produced by the external electrodes and the wiring of the printed circuit board in the region is reduced since the values of Bm and E in Formula 1 are decreased. In the related art, a region where the intensity of the density distribution of the magnetic flux is low is produced to reduce eddy-current loss. Therefore, the related art is subject to limitation in the shape, area, position, etc. of the external electrodes, and thus is deficient in mountability, as will be described later. Embodiment 1 is free from such limitation. Embodiment 1 varies the density distribution of the magnetic flux and enhances the mountability so as to increase the Q value.

Embodiment 2

The Inventors further noted the density distribution of the magnetic flux observed when a component is mounted on a printed circuit board, and found the following phenomenon. When a part of magnetic flux of a coil is blocked, the inductance is reduced. Since the Q value is generally proportional to inductance, the Q value should also be reduced. However, it was observed that the Q value was increased. This is because blocking of a part of the magnetic flux produces a portion where the intensity of the density distribution of the magnetic flux is low, and the eddy-current loss produced in this portion is reduced. Therefore, the Inventors conceived blocking a part of the magnetic flux of a necessary part with an internal conductor such as lead-out portions so as to produce a region where the intensity of the density distribution of the magnetic flux is low and increase the Q value.

Figure 7A:
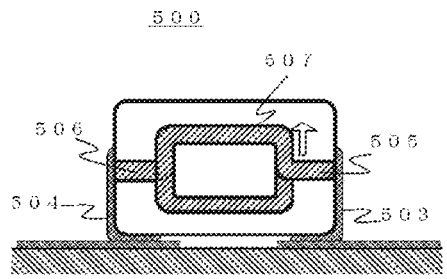
FIG. 7a is a perspective view of a laminated inductor of Embodiment 1 forming a basis of Embodiment 2.
Figure 7B:
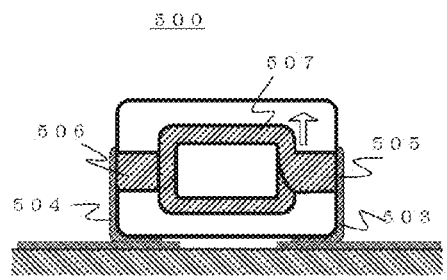
FIG. 7b is a perspective view of a laminated inductor of Embodiment 2.

FIG. 7b shows Embodiment 2, and FIG. 7a is a reproduction of FIG. 4b showing Embodiment 1 for comparison. In the laminated inductor 500, the lead-out portions 505, 506 may connect the coil 507 and the external electrodes 503, 504. As to the conductors constituting the coil 507 and the lead-out portions 505, 506, the direction parallel with the axis of the coil 507 may be referred to as the thickness of the conductor, and the direction orthogonal to the thickness direction may be referred to as the width of the conductor. In Embodiment 1 shown in FIG. 7a, the conductors constituting the coil 507 and lead-out portions 505, 506 may have the same width. In contrast, FIG. 7b shows that the conductor of the lead-out portions 505, 506 may have double the width of the conductor of the coil 507. Embodiments 1 and 2 may have the same configuration except that the lead-out portions 505, 506 are differently configured. In addition to the effect produced by the direction of turns in Embodiment 1 described above, Embodiment 2 having wide lead-out portions may produce a large effect of blocking the magnetic flux, such that the region where the intensity of the density distribution of the magnetic flux is low is produced to be larger, which may reduce the eddy-current loss produced by the external electrodes and the wiring of the printed circuit board. Thus, the Q value may be increased as compared to Embodiment 1.

A method of fabricating Embodiment 2 will now be described. Embodiment 2, which is characterized by the lead-out portions 505, 506 having a larger width than the coil 507, can be fabricated by the fabrication method of Embodiment 1. More specifically, printing may be performed such that the lead-out portions 505, 506 of Embodiment 1 may have the same width of 70 μm as the conductors of the coil 507, whereas in Embodiment 2, the conductors of the coil 507 may have a width of 70 μm and the conductors of the lead-out portions 505, 506 may have a width of 140 μm, thereby fabricating laminated inductors having external dimensions of 0.6 mm wide by 0.3 mm deep by 0.4 mm high, 3.5 turns in the coil, and an inductance of 3.9 nH. The simulation of the magnetic flux density distribution may be calculated on an assumption that the laminated inductor is mounted on a coplanar printed circuit board including a substrate material having a dielectric constant of 3.4 and a copper foil having a thickness of 18 μm pasted on the substrate material.

Figure 8A:
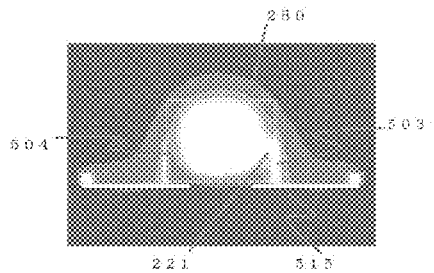
FIG. 8a is a sectional magnetic flux density distribution simulation diagram of a laminated inductor of Embodiment 1 forming a basis of Embodiment 2.
Figure 8B:
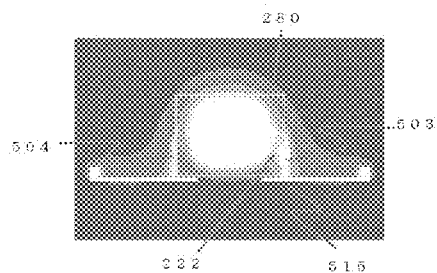
FIG. 8b is a sectional magnetic flux density distribution simulation diagram of a laminated inductor of Embodiment 2.
Figure 9:
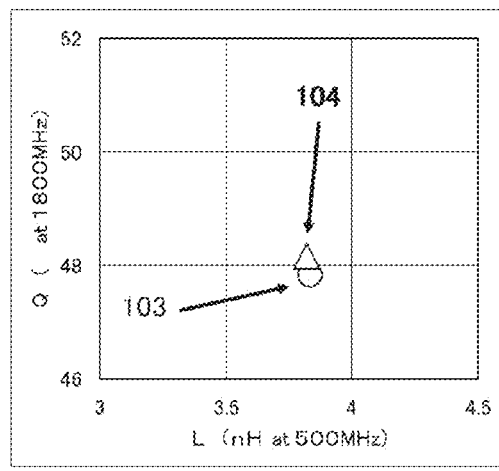
FIG. 9 shows the inductances (L values: 500 MHz) and the quality factors (Q values: 1800 MHz) of laminated inductors of Embodiment 1 and Embodiment 2 forming a basis of Embodiment 2.

FIG. 8a shows a magnetic flux density distribution simulation diagram of Embodiment 1 at a section where the lead-out portions 505, 506 connect to the external electrodes 503, 504, respectively. FIG. 8b shows the same for Embodiment 2. The white line 280 represents the external shape of the component. In these drawings, the portions where the intensity of the magnetic flux density distribution is high are colored in white, whereas the portions where the intensity of the magnetic flux density distribution is low are colored in black. In the printed circuit board 515, the copper foil wiring on the surface thereof appears white, and the electric current lead-in portions on the left and right sides appear white. Comparison between the portion indicated by the arrow 221 in FIG. 8a and the portion indicated by the arrow 222 in FIG. 8b shows that the portion indicated by the arrow 222 in FIG. 8b may include a larger area of region where the intensity of the density distribution of the magnetic flux is low, which indicates that the wide lead-out portions enlarge the region where the intensity of the density distribution of the magnetic flux is low FIG. 9 shows actual inductance and the Q value for Embodiment 1 and Embodiment 2. Embodiment 2 (104) may provide 0.4% lower inductance and a 0.8% higher Q value than Embodiment 1 (103).

In Embodiment 2, when the laminated inductor is mounted on a printed circuit board, the magnetic flux generated around the coiled conductor may be blocked by a part of the internal conductors, so as to produce a region where the intensity of the density distribution of the magnetic flux is low and reduce the eddy-current loss in the region by decreasing the values of Bm and E in Formula 1. Embodiment 2 varies the density distribution of the magnetic flux by blocking a part thereof and increases the Q value.

Embodiment 3

The Inventors studied various shapes and sizes of the lead-out portions for blocking the magnetic flux generated around the coiled conductors when the laminated inductor is mounted on a printed circuit board. As a result, it was found that, to increase the Q value, the thickness (t) of the conductors of the lead-out portions may not necessarily be small due to limitation by the eddy-current loss. The following relationship is known in connection with Q (quality factor). Formula 1 related to eddy-current loss is shown again for explanation.

$$Q = \frac{1}{2\pi fCR} = \frac{2\pi fL}{R} \qquad \text{Formula 2}$$

$$Pe = ke\frac{(tfBm)^2}{\rho} = ke\frac{(tE)^2}{\rho} \text{ (reproduction)} \qquad \text{Formula 1}$$

(Q: quality factor, π: circular constant, f: frequency, C: capacitance, R: conductor resistance, L: inductance) (Pe: eddy-current loss, ke: proportionality coefficient, t: thickness of conductor, f: frequency, Bm: maximum magnetic flux density, ρ: resistivity of magnetic body, E: voltage) Formula 1 indicates that a larger thickness (t) of a conductor may lead to larger eddy-current loss. However, since the conductor resistance (R) is inversely proportional to the thickness (t) of the conductor, the conductor resistance (R) can be reduced by increasing the thickness (t) of the conductor. Formula 2 indicates that a reduced conductor resistance (R) may lead to increased Q value.

The Inventors studied which of the reduction of the Q value caused by increased eddy-current loss and the increase of the Q value caused by the reduced conductor resistance (R) is superior. As a result, it was found that in a region where the intensity of the density distribution of the magnetic flux is low, the effect of the increased Q value caused by reduced conductor resistance (R) is superior to the effect of the reduced Q value caused by increased eddy-current loss. Thus, the conductor resistance (R) can be reduced and the Q value can be increased by modifying the shape or the size of the lead-out portions and increasing the sectional area.

Figure 10A:
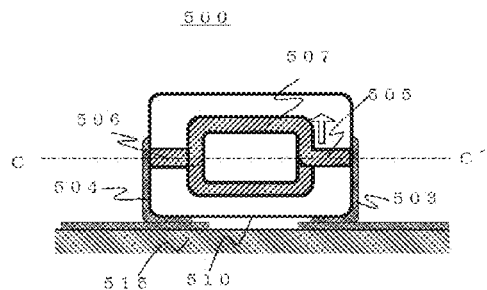
FIG. 10a is a perspective view of a laminated inductor of Embodiment 1 forming a basis of Embodiment 3.
Figure 10B:
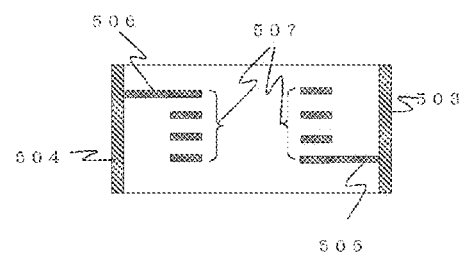
FIG. 10b is a sectional view of the same.
Figure 10C:
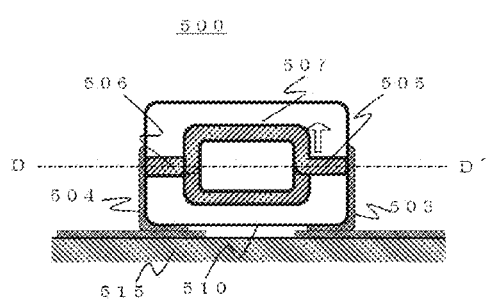
FIG. 10c is a perspective view of a laminated inductor of Embodiment 3.
Figure 10D:
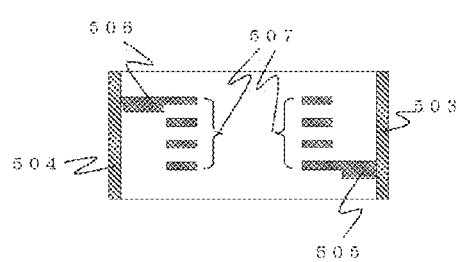
FIG. 10d is a sectional view of the same.

Embodiment 3 will now be described with reference to FIGS. 10a to 10d. In the laminated inductor 500, the lead-out portions 505, 506 may connect the coil 507 and the external electrodes 503, 504. The lead-out portions 505, 506 may be configured to block the magnetic flux generated from the coil 507. FIG. 10a is a reproduction of FIG. 4b showing Embodiment 1 for comparison. As shown in the sectional view of FIG. 10b along the line C-C' in FIG. 10a, the lead-out portions 505, 506 may have the same thickness as the coil 507. In contrast, Embodiment 3, which is shown in FIG. 10c and the sectional view of FIG. 10d along the line D-D' in FIG. 10c may include the lead-out portions 505, 506 having double the thickness of the conductors of the coil 507 so as to reduce the conductor resistance. Embodiments 1 and 3 may have the same configuration except that the lead-out portions 505, 506 are differently configured. In addition to the effect produced by the direction of turns in Embodiment 1 described above, Embodiment 3 shown in FIGS. 10c and 10d may be further configured such that the eddy-current loss is increased in accordance with the thickness of the conductors and the conductor resistance is reduced in accordance with the thickness of the conductors. Although the inductance is reduced as the eddy-current loss is increased, the Q value may be increased in Embodiment 3 because the effect of reducing the conductor resistance is superior to the effect of increasing the eddy-current loss.

A method of fabricating Embodiment 3 will now be described. Embodiment 3, which is characterized by the lead-out portions 505, 506 having a larger thickness of conductors than the coil 507, can be fabricated by the fabrication method of Embodiment 1. More specifically, printing may be performed such that the conductors of Embodiment 1 may have a thickness of 10 µm and the conductors of Embodiment 3 may have a thickness of 20 µm. In Embodiment 3, the laminated inductor fabricated may have external dimensions of 0.6 mm wide by 0.3 mm deep by 0.4 mm high, 3.5 turns in the coil, and an inductance of 3.9 nH. The simulation of the magnetic flux density distribution may be calculated on an assumption that the laminated inductor is mounted on a coplanar printed circuit board including a substrate material having a dielectric constant of 3.4 and a copper foil having a thickness of 18 µm pasted on the substrate material.

Figure 11A:
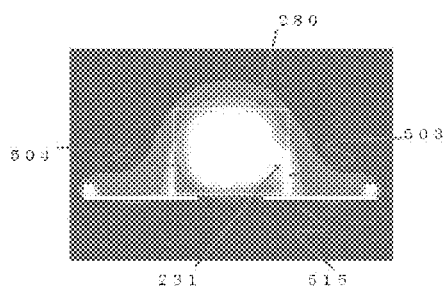
FIG. 11a is a magnetic flux density distribution simulation diagram of a laminated inductor of Embodiment 1 forming a basis of Embodiment 3.
Figure 11B:
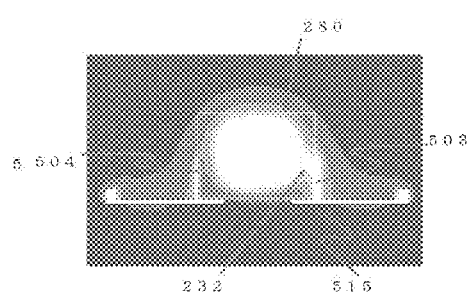
FIG. 11b is a magnetic flux density distribution simulation diagram of a laminated inductor of Embodiment 3.
Figure 12:
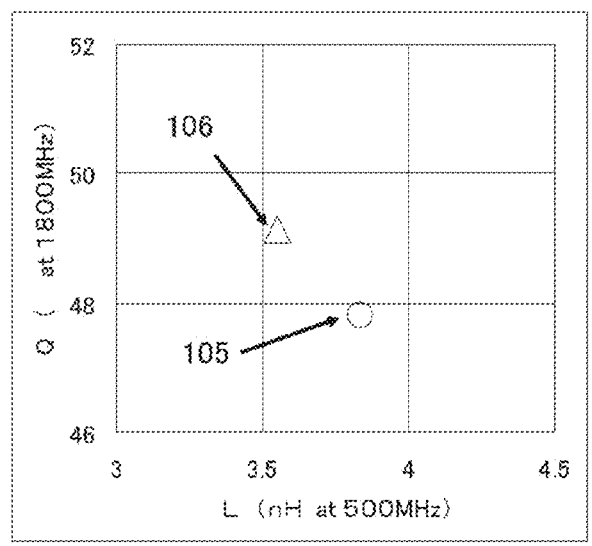
FIG. 12 shows the inductances (L values: 500 MHz) and the quality factors (Q values: 1800 MHz) of laminated inductors of Embodiment 1 forming a basis of Embodiment 3, and Embodiment 3.

FIG. 11a shows a magnetic flux density distribution simulation diagram of Embodiment 1 at a section where the lead-out portions 505, 506 connect to the external electrodes 503, 504, respectively. FIG. 11b shows the same for Embodiment 3. The white line 280 represents the external shape of the component. In these drawings, the portions where the intensity of the magnetic flux density distribution is high are colored in white, whereas the portions where the intensity of the magnetic flux density distribution is low are colored in black. In the printed circuit board 515, the copper foil wiring on the surface thereof appears white, and the electric current lead-in portions on the left and right sides appear white. Comparison between the portion indicated by the arrow 231 in FIG. 11a and the portion indicated by the arrow 232 in FIG. 11b shows that the regions where the intensity of the density distribution of the magnet flux is low are almost the same since the width of the magnetic flux blocked by the lead-out portions are the same. FIG. 12 shows actual inductance and the Q value for Embodiment 1 and Embodiment 3. Embodiment 3 (106) may provide 7.4% lower inductance but a 2.8% higher Q value than Embodiment 1 (105).

In Embodiment 3, when the laminated inductor is mounted on a printed circuit board, the magnetic flux generated around the coiled conductors may be blocked by a part of the internal conductors, so as to further increase the Q value by reducing the conductor resistance instead of reducing the eddy-current loss.

Embodiment 4

Figures 13A, 13B:
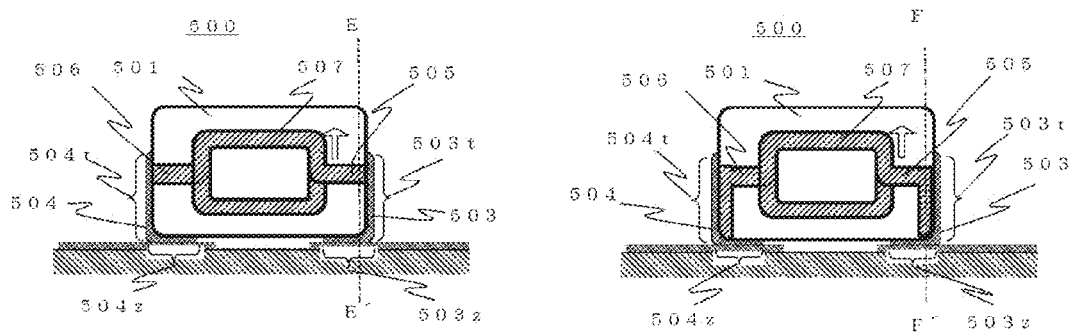
FIG. 13a is a perspective view of a laminated inductor of Embodiment 1 forming a basis of Embodiment 4 as viewed from a side.
FIG. 13b is a perspective view of a laminated inductor of a first example of Embodiment 4 as viewed from a side.
Figure 13C:
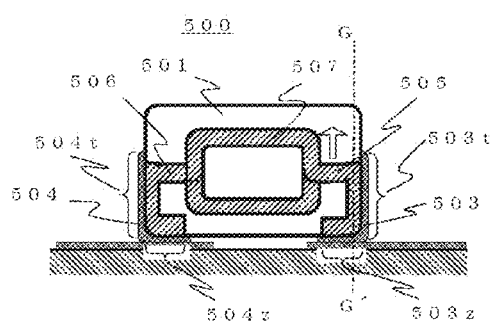
FIG. 13c is a perspective view of a laminated inductor of a second example of Embodiment 4 as viewed from a side.

Embodiment 4 will now be described with reference to FIGS. 13a to 13c. The laminated inductor 500 of Embodiment 4 may have the external electrodes 503, 504 formed to span two or more of the surfaces of the insulator 501. The portions of the external electrodes 503, 504 formed on the end surfaces of the insulator 501 may be denoted by 503t, 504t. The portions of the external electrodes 503, 504 formed on the mounting surface 510 may be denoted by 503z, 504z. In Embodiment 4, the lead-out portions 505, 506 of the laminated inductor 500 may be bent orthogonally to the axis of the coil to block the magnetic flux generated from the coil 507, and may connect to a plurality of surfaces 503t, 504t, 503z, and 504z constituting the external electrodes 503, 504. FIG. 13a is a reproduction of FIG. 4b showing Embodiment 1 for comparison. In Embodiment 1, the lead-out portions 505, 506 may be straight and connect only to the surfaces 503t, 504t of the external electrodes formed on the end surfaces. In contrast, in a first example of Embodiment 4 as shown in FIG. 13b, the lead-out portions 505, 506 may be connected to the surfaces 503t, 504t of the external electrodes and bent toward the mounting surface 510 such that the ends thereof connect to the surfaces 503z, 504z of the external electrodes. In a second example of Embodiment 4 as shown in FIG. 13c, the lead-out portions 505, 506 may be connected to the surfaces 503t, 504t of the external electrodes and bent toward the mounting surface 510 such that the ends thereof connect to and bent along the surfaces 503z, 504z of the external electrodes. Embodiments 1 and 4 may have the same configuration except that the lead-out portions 505, 506 are differently configured. In addition to the effect produced by the direction of turns in Embodiment 1 described above, the first and second examples of Embodiment 4 may be further configured such that the lead-out portions 505, 506 may be bent orthogonally to the axis of the coil so as to block a larger portion of the magnetic flux generated from the coil 507 than in Embodiment 1, and the lead-out portions 505, 506 may be bent toward the mounting surface 510 so as to block a larger portion of the magnetic flux on the mounting surface 510 side than in Embodiment 1. Since the magnetic flux is blocked in a larger area than in Embodiment 1, the inductance may be reduced and the eddy-current loss may be increased. However, due to the effect of reducing the conductor resistance caused by the increased area of tight adhesion to the external electrodes, the Q value may be increased against the effects of the reduced inductance and the increased eddy-current loss.

A method of fabricating Embodiment 4 will now be described. Embodiment 4, which is characterized by the lead-out portions bent to block the magnetic flux, can be fabricated by printing the lead-out portions in such a pattern as to be connected to the external electrodes formed on a plurality of surfaces of the insulator, and performing the other steps in the fabrication method of Embodiment 1. More specifically, printing may be performed such that the lead-out portions of Embodiment 1 may have such a shape as to connect only to the external electrodes formed on the end surfaces, and the lead-out portions of the two examples of Embodiment 4 may have such a shape as to connect to the external electrodes formed on the end surfaces and the external electrodes formed on the mounting surface so as to block the magnetic flux. In Embodiment 4, the laminated inductor fabricated may have external dimensions of 0.6 mm wide by 0.3 mm deep by 0.4 mm high, 3.5 turns in the coil, and an inductance of 3.9 nH. The simulation of the magnetic flux density distribution may be calculated on an assumption that the laminated inductor is mounted on a coplanar printed circuit board including a substrate material having a dielectric constant of 3.4 and a copper foil having a thickness of 18 µm pasted on the substrate material.

Figure 14A:
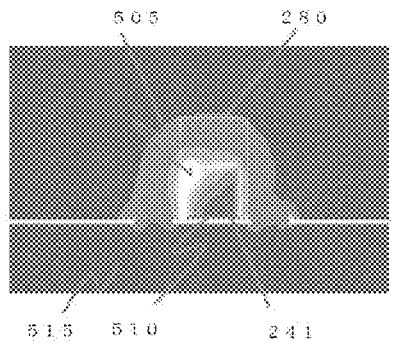
FIG. 14a is a magnetic flux density distribution simulation diagram of a laminated inductor of Embodiment 1 forming a basis of Embodiment 4.
Figure 14B:
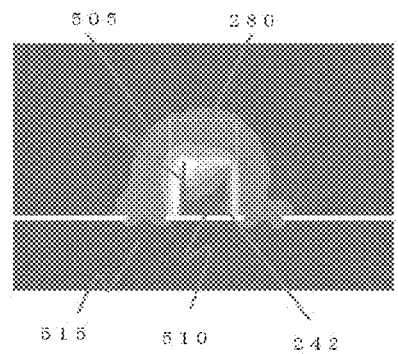
FIG. 14b is a magnetic flux density distribution simulation diagram of a laminated inductor of a first example of Embodiment 4.
Figure 14C:
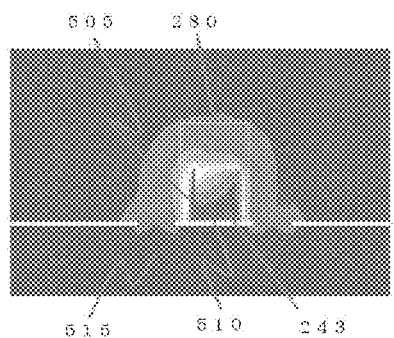
FIG. 14c is a magnetic flux density distribution simulation diagram of a laminated inductor of a second example of Embodiment 4.
Figure 15:
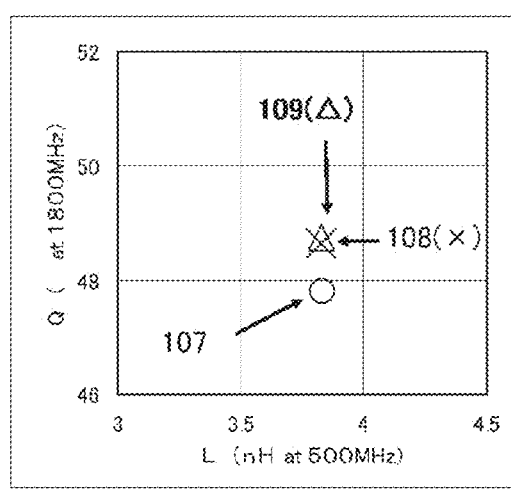
FIG. 15 shows the inductances (L values: 500 MHz) and the quality factors (Q values: 1800 MHz) of laminated inductors of Embodiment 1 forming a basis of Embodiment 4, and the first example and the second example of Embodiment 4.

FIGS. 14a, 14b, and 14c show magnetic flux density distribution simulation diagrams for Embodiment 1, and the first and second examples of Embodiment 4, respectively. FIGS. 14a, 14b, and 14c show simulations of magnetic flux density distribution along the sections E-E', F-F', and G-G' around the external electrodes 503 in FIGS. 13a, 13b, and 13c, respectively. The white line 280 represents the external shape of the component. In these drawings, the portions where the intensity of the magnetic flux density distribution is high are colored in white, whereas the portions where the intensity of the magnetic flux density distribution is low are colored in black. The copper foil wiring on the surface of the printed circuit board 515 appears white. The lead-out portions 505 appear black. Embodiment 1 includes a weak magnetic flux portion 241 appearing black near the mounting surface 510, while both examples of Embodiment 4 include weak magnetic flux portions 242, 243 appearing black near the mounting surface 510 that are larger than that in Embodiment 1. FIG. 15 shows actual inductance and the Q value for Embodiment 1 and the first and second examples of Embodiment 4. As compared to Embodiment 1 (107), the first example (108) and the second example (109) of Embodiment 4 may provide −0.3% lower inductance and −0.3% lower inductance but 1.8% higher Q value and 2.0% higher Q value, respectively. Although the relation of Q value (Formula 2) indicates that the Q value is proportional to L, it is understood that in this embodiment, the Q value is not reduced but increased despite reduction of L.

In Embodiment 4, when the laminated inductor is mounted on the printed circuit board, the external electrodes thereof may be formed on two or more surfaces of the insulator. If the lead-out portions bent orthogonally to the coil axis to block the magnetic flux generated from the coil are connected to the external electrodes formed on a plurality of surfaces of the insulator, the Q value can be further increased by connecting the lead-out portions to the external electrodes formed on a plurality of surfaces of the insulator to reduce conductor resistance rather than by reducing eddy-current loss.

Embodiment 5

Figure 16A:
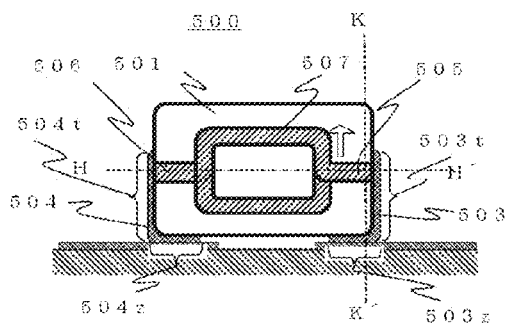
FIG. 16a is a perspective view of a laminated inductor of Embodiment 1 forming a basis of Embodiment 5.
Figure 16B:
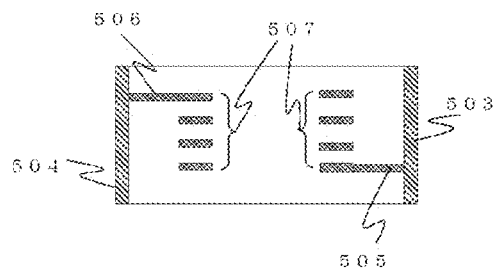
FIG. 16b is a sectional view of the same.
Figure 16C:
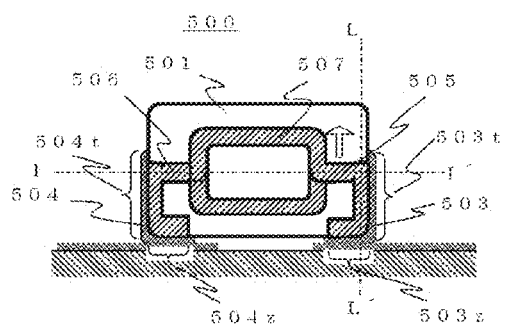
FIG. 16c is a perspective view of a laminated inductor of a first example of Embodiment 5.
Figure 16D:
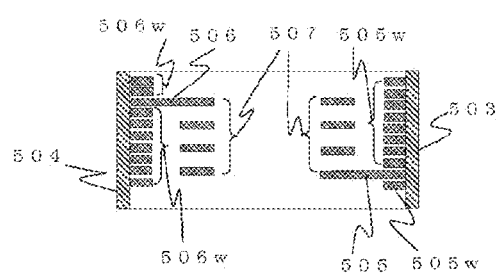
FIG. 16d is a sectional view of the same.
Figure 16E:
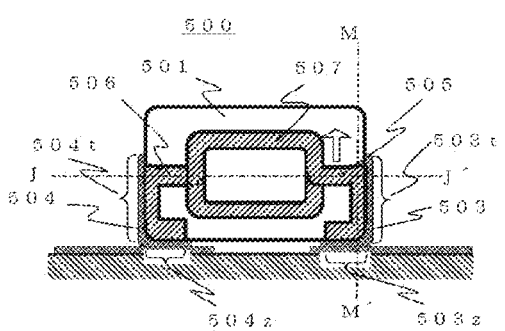
FIG. 16e is a perspective view of a laminated inductor of a second example of Embodiment 5.
Figure 16F:
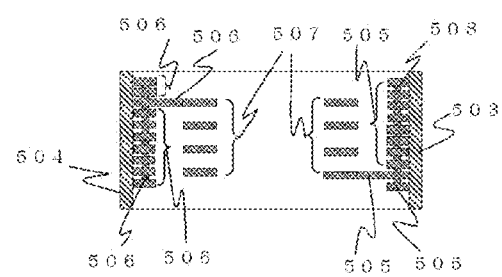
FIG. 16f is a sectional view of the same.

Embodiment 5 will now be described with reference to FIGS. 16a to 16e. In Embodiment 5, the lead-out portions 505, 506 of the laminated inductor 500 may be bent orthogonally to the axis of the coil to block the magnetic flux generated from the coil 507, and may connect to the external electrodes 503, 504 on two or more planar or linear areas. FIG. 16a is a reproduction of FIG. 4b showing Embodiment 1 for comparison. In Embodiment 1, the lead-out portions 505, 506 may be straight and connect to the external electrodes 503, 504 at only one portion, and the section along the H-H' dotted line is shown in FIG. 16b. In contrast, a first example of Embodiment 5, shown in FIG. 16c and the sectional view thereof in FIG. 16d along the I-I' dotted line in FIG. 16c, may include a plurality of dummy lead-out portions 505w, 506w arranged in parallel with the lead-out portions 505, 506. The lead-out portions 505, 506 may be configured in the same manner as in the second example of Embodiment 4. The dummy lead-out portions 505w, 506w may include conductors having a shape similar to those of the lead-out portions 505, 506 except the connection portion to the coil 507, and these conductors may be arranged in parallel with the lead-out portions 505, 506 into a layered form along with a plurality of insulator layers placed between the conductors. The layers may be connected to the external electrodes 503, 504. A second example of Embodiment 5, shown in FIG. 16e and the sectional view thereof in FIG. 16f along the J-J' dotted line in FIG. 16e, may have the conductors of the lead-out portions 505, 506 formed into a plurality of layers and integrated together by lamination. The conductors of the plurality of layers may be connected together via a large number of via-hole conductors 508 to enlarge the surface area and the sectional area of the conductors, such that the connection area to the external electrodes 503, 504 may be larger than the sectional area of the conductors of the coil 507. More specifically, the lead-out portions 505, 506 and the plurality of dummy lead-out portions 505w, 506w in the first example may be connected and integrated together via a large number of via-holes 508 to form the lead-out portions 505, 506 as a whole. Thus, the lead-out portions 505, 506 may be connected to the external electrodes 503, 504 on an area larger than the sectional area of the conductors of the coil 507. The first and second examples of Embodiment 5 may have the same configuration as Embodiment 1 except that the shapes of the lead-out portions 505, 506 are different between these embodiments. In addition to the effect produced by the direction of turns in Embodiment 1 described above, the first and second examples of Embodiment 5 may be further configured as in Embodiment 4 such that the lead-out portions 505, 506 may be bent to block a larger portion of the magnetic flux than in Embodiment 1. Furthermore, in the first example, a plurality of layers of the dummy lead-out portions 505w, 506w may block a larger portion of the magnetic flux than in the embodiment where one layer of the lead-out portions 505, 506 blocks the magnetic flux. In the second example where the conductors of the lead-out portions formed in a plurality of layers are integrated via the via-hole conductors 508 to form the lead-out portions 505, 506 as a whole, the conductor resistance may be further reduced in addition to the effect of blocking the magnetic flux in the first example. Since the magnetic flux is blocked in a larger area in these examples than in Embodiment 1, the inductance may be reduced and the eddy-current loss may be increased. However, due to the effect of reducing the conductor resistance caused by the increased area of connection to the external electrodes, the Q value may be increased against the effects of the reduced inductance and the increased eddy-current loss.

A method of fabricating Embodiment 5 will now be described. Embodiment 5, which is characterized by the lead-out portions connected to the external electrodes on two or more planar or linear areas, can be fabricated by the fabrication method of Embodiment 1. More specifically, in Embodiment 1, the lead-out portions may be printed so as to be connected only to the external electrodes formed on the end surfaces. In contrast, in the first example of Embodiment 5, the lead-out portions may be printed to have such a pattern shape as to connect to each surface of the external electrodes formed on the end surface and the mounting surface of the insulator. Then, the dummy lead-out portions having a shape similar to those of the lead-out portions may be printed on a plurality of green sheets in a predetermined pattern shape. The lead-out portions and the plurality of layers of the dummy lead-out portions may be stacked together. In the second example of Embodiment 5, the lead-out portions may be printed on green sheets previously provided with via-holes at predetermined positions to have such a pattern shape as to connect to each surface of the external electrodes formed on the end surface and the mounting surface of the insulator. Then, a pattern shape similar to those of the lead-out portions except for the connection portion may be printed to form a plurality of conductors. The lead-out portions and the plurality of conductors may be stacked together into a plurality of layers of lead-out portions. In Embodiment 5, the laminated inductor fabricated may have external dimensions of 0.6 mm wide by 0.3 mm deep by 0.4 mm high, 3.5 turns in the coil, and an inductance of 3.9 nH. The simulation of the magnetic flux density distribution may be calculated on an assumption that the laminated inductor is mounted on a coplanar printed circuit board including a substrate material having a dielectric constant of 3.4 and a copper foil having a thickness of 18 μm pasted on the substrate material.

Figure 17A:
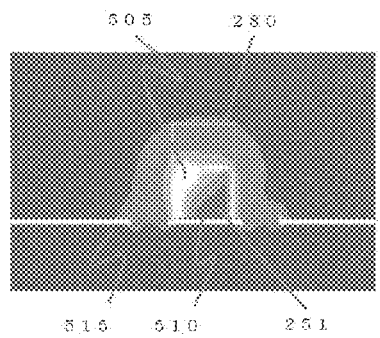
FIG. 17a is a magnetic flux density distribution simulation diagram of a laminated inductor of Embodiment 1 forming a basis of Embodiment 5.
Figure 17B:
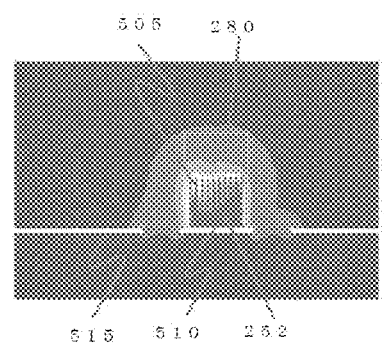
FIG. 17b is a magnetic flux density distribution simulation diagram of a laminated inductor of a first example of Embodiment 5.
Figure 17C:
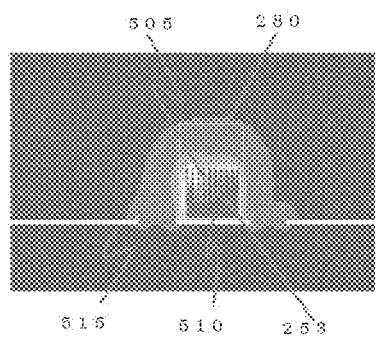
FIG. 17c is a magnetic flux density distribution simulation diagram of a laminated inductor of a second example of Embodiment 5.
Figure 18:
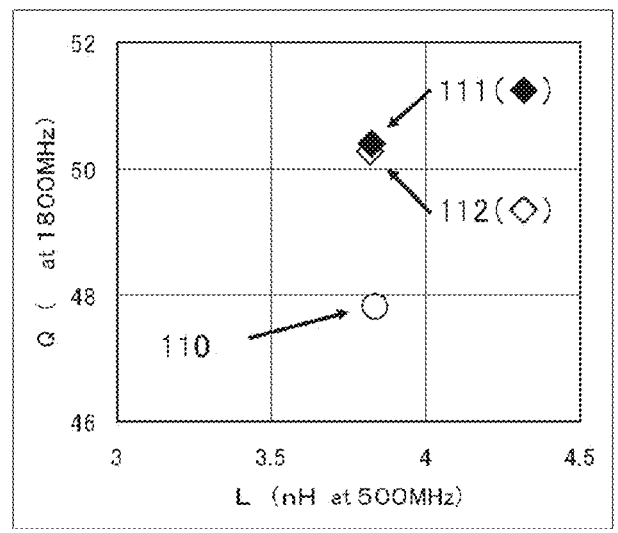
FIG. 18 shows the inductances (L values: 500 MHz) and the quality factors (Q values: 1800 MHz) of laminated inductors of Embodiment 1 forming basis of Embodiment 5, and the first example and the second example of Embodiment 5.

FIGS. 17a, 17b, and 17c show magnetic flux density distribution simulation diagrams for Embodiment 1, and the first and second examples of Embodiment 5, respectively. FIGS. 17a, 17b, and 17c show simulations of magnetic flux density distribution along the sections K-K', L-L', and M-M' around the external electrodes 503 in FIGS. 16a, 16c, and 16e, respectively. The white line 280 represents the external shape of the component. In these drawings, the portions where the intensity of the magnetic flux density distribution is high are colored in white, whereas the portions where the intensity of the magnetic flux density distribution is low are colored in black. The copper foil wiring on the surface of the printed circuit board 515 appears white. The lead-out portions 505 appear black. Embodiment 1 includes a weak magnetic flux portion 251 appearing black near the mounting surface 510, while both examples of this embodiment include weak magnetic flux portions 252, 253 appearing black near the mounting surface 510 that are larger than that in Embodiment 1. FIG. 18 shows actual inductance and the Q value for Embodiment 1 and the first and second examples of Embodiment 5. As compared to Embodiment 1 (110), the first example (111) and the second example (112) of Embodiment 5 may provide 0.3% lower inductance and 0.4% lower inductance but 5.4% higher Q value and 5.1% higher Q value, respectively.

In Embodiment 5, when the laminated inductor is mounted on a printed circuit board, the lead-out portions may be bent orthogonally to the coil axis to block the magnetic flux generated from the coil and may be connected to the external electrodes on two or more planar or linear areas, so as to further increase the Q value by reducing the conductor resistance instead of reducing the eddy-current loss.

In the related art, there was a limitation of the external electrodes so as to have such a shape, area, and position as not to increase the eddy-current loss. Therefore, when the inductor is mounted with solder on a land pattern on a printed circuit board, it was difficult to configure the external electrodes to provide excellent mountability such as positional accuracy and adhesive strength on the printed circuit board. In the embodiment, the external electrodes may be positioned in a region where the effect of the intensity of the magnetic flux density distribution is small, such that the position of the connection portion between the lead-out portions and the external electrodes can be set desirably, and the shape and the area of the external electrodes can be designed freely. Further, the external electrodes can be provided on surfaces other than the mounting surface such as the end surfaces or the side surfaces, so as to achieve self-alignment. Self-alignment refers to alignment of a component body at a center of the mounting position, driven by the tension from the solder molten in mounting, so as to balance the tension on the surfaces of the external electrodes. Self-alignment may prevent horizontal rotation of a component being mounted with respect to the mounting surface and also prevent component rising (a phenomenon called Manhattan or Tombstone in which a component disengaged from a land pattern on one side stands upright on the other land side and appears like a building or a gravestone; this phenomenon occurs when solder tension is applied only to one of the external electrodes).

Figure 19A:
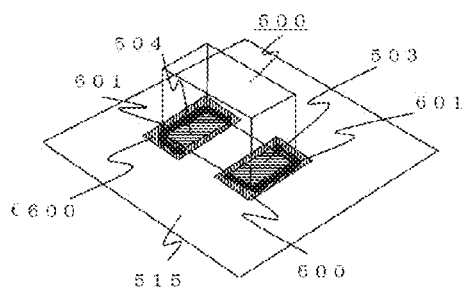
FIG. 19a shows an example of a printed circuit board having external electrodes formed only on a mounting surface.
Figure 19B:
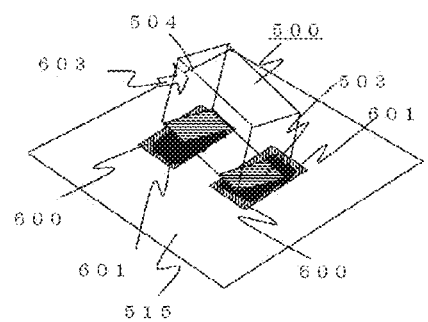
FIG. 19b shows an example of a printed circuit board as shown in FIG. 19a under a stress due to a disturbance factor occurring on reflow.

The mountability will now be described with reference to drawings showing a specific example. To reduce eddy-current loss in the related art, it was desirable that, as shown in FIG. 19a, the external electrodes 503, 504 should be made only on the mounting surface to have minimized areas. When the laminated inductor 500 is mounted on a predetermined position in a land pattern 600 on a printed circuit board 515 supplied with solder for mounting, and the solder is molten in a reflow furnace for mounting the laminated inductor 500, almost no solder wetting 601 occurs from the external electrodes 503, 504 mounted only on the mounting surface, as shown in FIG. 19a, thus producing almost no tension by the solder. Therefore, the adhesive strength of the laminated inductor 500 on the printed circuit board 515 may be low since the solder does not contribute to the adhesive strength of the wetting portion. In such an arrangement, when as shown in FIG. 19b, a stress 603 is applied to the laminated inductor 500 being in a reflow process due to a disturbance factor, there is no self-alignment driven by the tension of solder, and the component may be largely misaligned.

Figure 19C:
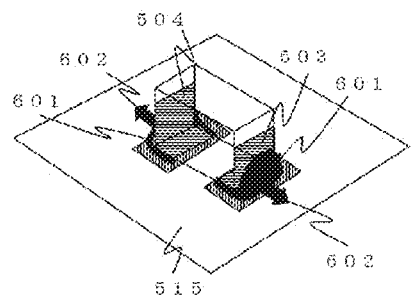
FIG. 19c shows an example of a printed circuit board having external electrodes formed on a mounting surface and part of an end surface.
Figure 19D:
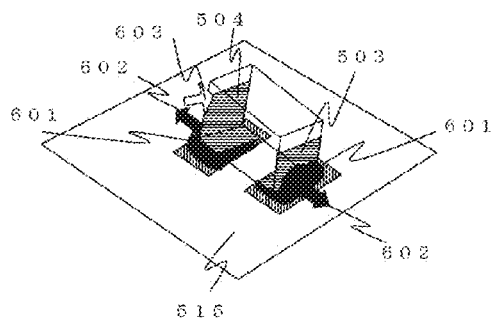
FIG. 19d shows an example of a printed circuit board as shown in FIG. 19c under a stress due to a disturbance factor occurring on reflow.

FIG. 19c shows an example in which the external electrodes 503, 504 extend on the mounting surface and a part of the end surfaces, such that the adhesion strength on the printed circuit board 515 is improved while the eddy current is increased. The external electrodes of the related art and Embodiments 1 to 5 may have this shape for comparison. When the external electrodes 503, 504 extend on the mounting surface and a part of the end surfaces, solder wetting 601 may occur to the portions of the electrodes formed on the end surfaces, thus producing the tension 602 by the solder in two directions. Due to such a structure of the external electrodes, solder wetting portion in the portion of the electrodes on the side surfaces may contribute to the adhesion strength on the printed circuit board 515, and therefore, the adhesion strength on the printed circuit board 515 may be improved. However, the tension 602 by the solder may occur in only two directions toward the end surfaces during the reflow process. Therefore, as shown in FIG. 19d, when a stress 603 is applied due to a disturbance factor, there may be a direction in which self-alignment driven by the tension 602 produced by the solder does not occur, causing misalignment of the component.

Figure 19E:
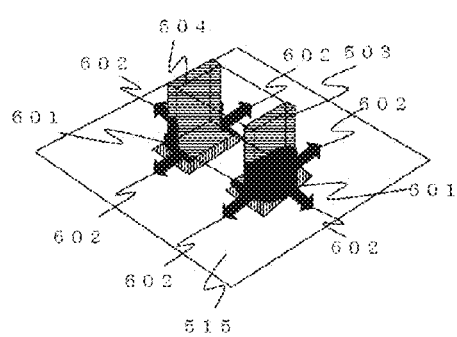
FIG. 19e shows an example of a printed circuit board having external electrodes formed on five surfaces including a mounting surface, an end surface, two side surfaces, and top surface.
Figure 19F:
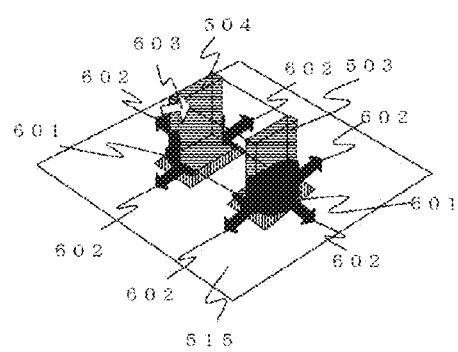
FIG. 19f shows an example of a printed circuit board as shown in FIG. 19e under a stress due to a disturbance factor occurring on reflow.

FIG. 19e shows the configuration of the external electrodes 503, 504 that was considered to reduce the Q value in the related art due to large eddy-current loss. The external electrodes 503, 504 may have large areas and extend to the end surfaces and the side surfaces adjacent to the mounting surface, and these portions may contribute to the solder wetting. Therefore, the amount of solder wetting 601 may be large, and the adhesion strength on the printed circuit board 515 may be high. Further, the tension 602 by the solder may occur in four directions. Therefore, as shown in FIG. 19f, self-alignment driven by the tension 602 produced by the solder may occur on the stress 603 due to a disturbance factor during the reflow process, thereby suppressing the misalignment of the component. In the embodiment in which the effect of eddy-current loss is reduced may employ this shape of external electrodes.

This embodiment may be designed to have a mounting area allowing for mountability irrespective of the amount of the eddy-current loss and the external electrodes allowing for the solder wetting areas on the surface of the external electrodes, so as to ensure the solder mountability and the mounting strength.

In the embodiments of the present invention, the positions and the shapes of the pair of external electrodes can be selected desirably. More specifically, the external electrodes can be formed on the mounting surface, the top surface facing the mounting surface, the two side surfaces intersecting the axis of the coil, and the two end surfaces parallel with the axis of the coil and adjacent to both the mounting surface and the top surface. An external electrode may be referred to as a one-surface electrode, two-surface electrode, three-surface electrode, four-surface electrode, or five-surface electrode depending on the number of surfaces of a component body covered by the external electrode. The embodiments of the present invention may employ any of these electrodes. For more details, the positions of the external electrodes are illustrated in the drawings omitting the interior of a component. FIGS. 20a to 20c show one-surface electrodes formed only on the mounting surface or the end surfaces; FIGS. 21a and 21b show two-surface electrodes formed on both the mounting surface and the end surfaces; FIGS. 22a and 22b show three-surface electrodes formed by extending the two-surface external electrodes onto the top surface; FIGS. 23a to 23e show four-surface electrodes formed by extending the two-surface external electrodes onto the two side surfaces; and FIGS. 24a and 24b show five-surface electrodes formed by extending the four-surface external electrodes onto the top surface. The embodiments of the present invention may employ these various external electrodes.

In the embodiments of the present invention, it is important that a component should be mounted on a board in a correct direction. Although the mounting surface may be identified from the positions and the shapes of electrodes, the laminated inductor of the embodiments of the present invention may have markers for an automatic mounting machine to identify the mounting direction. A direction identifying marker provided on the top surface of a component may be formed of an insulator so as not to interfere the density distribution of the magnetic flux from the coil, and more preferably, a plurality of such direction identifying markers may be provided in sections different than the coil. A direction identifying marker provided on the mounting surface may be formed of an insulator or a conductor and placed in a region where the intensity of density distribution of the magnetic flux from the coil is low, and more preferably, the conductor may be exposed so as to be connected to an external electrode, and a plurality of such direction identifying markers may be provided in sections different than the coil. Providing a plurality of direction identifying markers may make the markers more visible and identifiable.

Figure 25A:
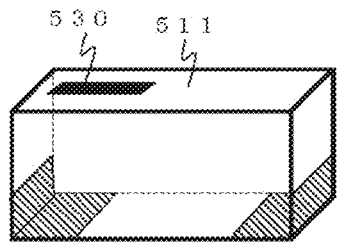
FIG. 25a shows an arrangement of a direction identifying marker and external electrodes according to the embodiment.
Figure 25B:
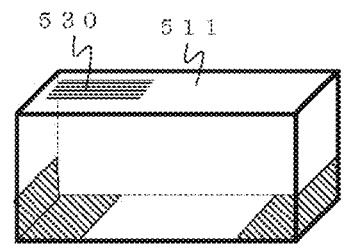
FIG. 25b shows an arrangement of a direction identifying marker and external electrodes according to the embodiment.
Figure 25C:
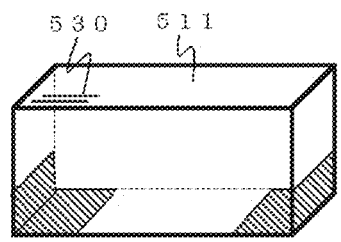
FIG. 25c shows an arrangement of a direction identifying marker and external electrodes according to the embodiment.
Figure 25D:
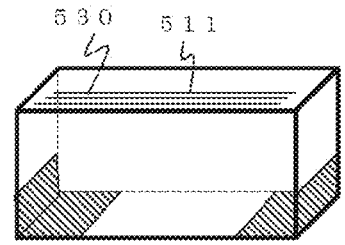
FIG. 25d shows an arrangement of a direction identifying marker and external electrodes according to the embodiment.
Figure 26A:
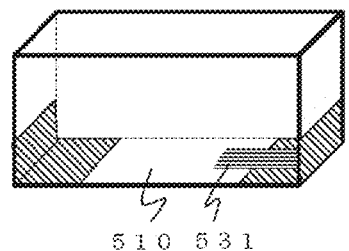
FIG. 26a shows an arrangement of a direction identifying marker and external electrodes according to the embodiment.
Figure 26B:
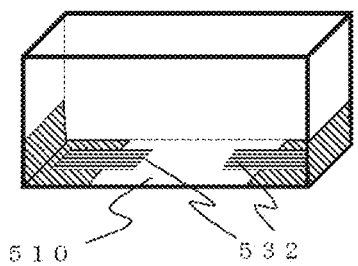
FIG. 26b shows an arrangement of a direction identifying marker and external electrodes according to the embodiment.
Figure 27:
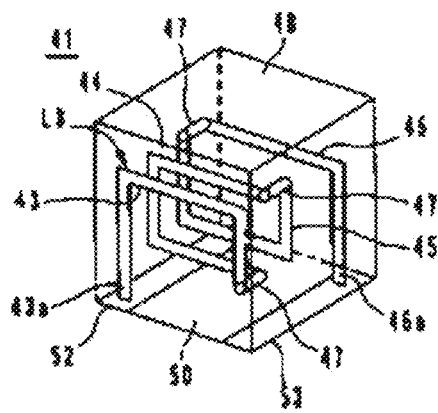
FIG. 27 is a perspective view of an inductor of a related art quoted from FIG. 2 of Japanese Patent No. 3058164.
Figure 28:
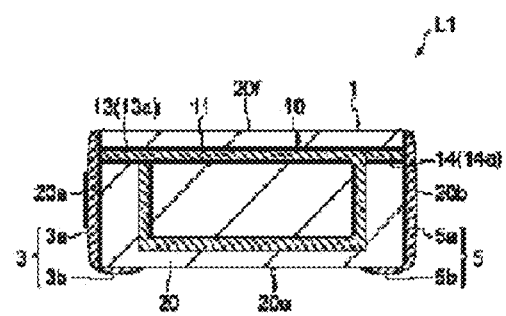
FIG. 28 is a sectional view of an inductor of a related art quoted from FIG. 2 of Japanese Patent No. 4019071.
Figure 29:
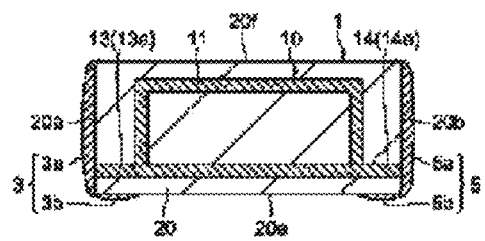
FIG. 29 is a sectional view of an inductor of a related art quoted from FIG. 12 of Japanese Patent No. 4019071.

It can be desirably selected whether to provide a direction identifying marker, and the position of the direction identifying marker can be desirably selected in consideration of the region where the intensity of density distribution of the magnetic flux is low. The positions of a direction identifying marker and the external electrodes will now be described with reference to the drawings omitting the interior of a component. Examples preferably having a direction identifying marker formed of an insulator and placed outside the region where the intensity of the density distribution of the magnetic flux is low may include: a component shown in FIG. 25a having a marker 530 formed on the top surface 511 after lamination; a component shown in FIG. 25b having a marker 530 formed by printing, etc., on a coil conductor layer before lamination and exposed from the top surface 511; a component shown in FIG. 25c having a marker 530 formed by printing. etc., on a layer other than the coil conductor layers before lamination and exposed from the top surface 511; and a component shown in FIG. 25d having a marker 530 formed by printing. etc., on both a coil conductor layer and a layer other than the coil conductor layers and exposed from the top surface 511. Examples preferably having a direction identifying marker formed of an insulator and placed in the region where the intensity of the density distribution of the magnetic flux is low may include: a component shown in FIG. 26a having a marker 531 formed by printing, etc., on a coil conductor layer before lamination and exposed from the mounting surface 510; and a component shown in FIG. 26b having markers 532 formed by printing, etc., between the coil conductor layers before lamination and exposed from the mounting surface 510. When markers are formed in the mounting surface by printing on conductors, the markers may be connected to the external electrodes so as to increase the adhesion strength in mounting. It may be preferable that the markers have the same length to prevent misalignment of the component being mounted.

The embodiments of the present invention have been described on an inductor including a single coiled conductor, but can be applied to an inductor including a plurality of coiled conductors. Such examples may include an inductor array electronic component.

What is claimed is:

1. An inductor comprising:
   an insulator having a plurality of surfaces including a mounting surface, a first end surface, and a second end surface, the first end surface and the second end surface facing each other and connected to the mounting surface;
   a first external electrode formed on the mounting surface and the first end surface of the insulator, the first external electrode including a first end portion provided on the first end surface and a first mounting portion provided on the mounting surface;
   a second external electrode formed on the mounting surface and the second end surface of the insulator, the second external electrode includes a second end portion provided on the second end surface and a second mounting portion provided on the mounting surface;
   a coil formed in the insulator having one end and the other end thereof formed in a direction away from the mounting surface, the coil being disposed such that an axis of the coil is parallel to the mounting surface, the first end surface, and the second end surface;
   a first lead-out portion having at least a portion thereof formed in the insulator, one end of the first lead-out portion being electrically connected to the coil, the other end of the first lead-out portion being electrically connected to the first end portion and the first mounting portion of the first external electrode;
   a second lead-out portion having at least a portion thereof formed in the insulator, one end of the second lead-out portion being electrically connected to the coil, the other end of the second lead-out portion being electrically connected to the second end portion and the second mounting portion of the second external electrode;
   wherein the first lead-out portion and the second lead-out portion are connected to the coil at positions more distant from the mounting surface than a portion of the coil closest to the mounting surface, and wherein the first lead-out portion and the second lead-out portion are bent toward the mounting surface such that the other end of the first lead-out portion is connected to the first mounting portion and the other end of the second lead-out portion is connected to the second mounting portion.

2. The inductor of claim 1 wherein the other end of the first lead-out portion and the other end of the second lead-out portion are bent along the mounting surface.

3. The inductor of claim 1 wherein a portion or the entirety of conductors in each of the first lead-out portion and the second lead-out portion has a larger sectional area than conductors in the coil.

4. The inductor of claim 1 wherein conductors in each of the first lead-out portion and the second lead-out portion have a larger thickness than conductors in the coil.

5. The inductor of claim 1 wherein the first lead-out portion and the second lead-out portion are each connected to the external electrodes on two or more planar or linear areas.

6. The inductor of claim 1 wherein the insulator is a lamination of insulating layers and conductors formed on surfaces of the insulating layers.

7. A printed circuit board having the inductor of claim 1 mounted thereon.

* * * * *